(12) United States Patent
Rush et al.

(10) Patent No.: US 11,950,394 B2
(45) Date of Patent: Apr. 2, 2024

(54) LIQUID-COOLED ASSEMBLY AND METHOD

(71) Applicant: GE AVIATION SYSTEMS LLC, Grand Rapids, MI (US)

(72) Inventors: Brian Magann Rush, Niskayuna, NY (US); Christopher James Kapusta, Delanson, NY (US); David Richard Esler, Gloversville, NY (US); Liang Yin, Clifton Park, NY (US); Richard Anthony Eddins, Margate, FL (US); Judd Everett Swanson, Margate, FL (US); Liqiang Yang, Coral Springs, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 156 days.

(21) Appl. No.: 17/499,324

(22) Filed: Oct. 12, 2021

(65) Prior Publication Data
US 2023/0114057 A1    Apr. 13, 2023

(51) Int. Cl.
*H05K 7/20* (2006.01)
*H01L 23/473* (2006.01)

(52) U.S. Cl.
CPC ..... *H05K 7/20345* (2013.01); *H01L 23/4735* (2013.01); *H05K 7/20272* (2013.01); *H05K 7/20936* (2013.01)

(58) Field of Classification Search
CPC ........... H05K 7/20345; H05K 7/20927; H05K 7/20936; H05K 7/20272; H01L 23/4336; H01L 23/4735
See application file for complete search history.

(56) References Cited

U.S. PATENT DOCUMENTS

| | | | |
|---|---|---|---|
| 4,912,600 A * | 3/1990 | Jaeger | H01L 23/4735 174/15.1 |
| 5,718,117 A | 2/1998 | McDunn et al. | |
| 5,831,824 A | 11/1998 | McDunn et al. | |
| 7,149,084 B2 | 12/2006 | Matsushima et al. | |
| 7,312,987 B1 | 12/2007 | Konshak | |

(Continued)

FOREIGN PATENT DOCUMENTS

| | | | |
|---|---|---|---|
| CN | 108174574 A | 6/2018 | |
| DE | 10146558 A1 * | 4/2003 | ......... H01L 23/4735 |

(Continued)

OTHER PUBLICATIONS

Yin et al., POL-kw Modules for High Power Applications, Aug. 3, 2017, 2017 IEEE 67th Electronic Components and Technology Conference (ECTC), pp. 2377-5726 Conference Location: Orlando, FL, USA.

(Continued)

*Primary Examiner* — Zachary Pape
(74) *Attorney, Agent, or Firm* — McGarry Bair PC

(57) ABSTRACT

The disclosure relates to an apparatus and method for liquid cooling of an electronic component. A housing includes an insertion slot and defines at least one component chamber for carrying the electronic component. A fluid inlet and fluid outlet are provided on the housing. A liquid coolant circuit passes through the housing at least from the inlet to the outlet.

16 Claims, 7 Drawing Sheets

(56) References Cited

U.S. PATENT DOCUMENTS

| | | | |
|---|---|---|---|
| 7,477,513 B1* | 1/2009 | Cader | H05K 7/20345 |
| | | | 257/714 |
| 7,697,292 B2 | 4/2010 | Uluc et al. | |
| 8,208,258 B2 | 6/2012 | Campbell et al. | |
| 8,358,000 B2 | 1/2013 | Beaupre et al. | |
| 8,653,635 B2 | 2/2014 | Gowda et al. | |
| 9,142,484 B2 | 9/2015 | Delgado et al. | |
| 9,337,163 B2 | 5/2016 | Delgado et al. | |
| 9,391,027 B2 | 7/2016 | Chauhan et al. | |
| 9,437,523 B2* | 9/2016 | Joshi | H01L 23/4735 |
| 9,704,788 B2 | 7/2017 | Gowda et al. | |
| 9,736,967 B2 | 8/2017 | Molitor et al. | |
| 10,231,364 B2 | 3/2019 | Dede et al. | |
| 2008/0111322 A1* | 5/2008 | Otsubo | F16L 55/1108 |
| | | | 277/654 |
| 2012/0224326 A1* | 9/2012 | Kohlberger | H01M 10/656 |
| | | | 361/689 |
| 2015/0092349 A1 | 4/2015 | Elison et al. | |
| 2020/0091686 A1* | 3/2020 | Yang | B64D 33/00 |
| 2022/0230938 A1* | 7/2022 | Coppola | H01L 23/4735 |

FOREIGN PATENT DOCUMENTS

| | | |
|---|---|---|
| EP | 2256772 B1 | 9/2013 |
| EP | 3606307 B1 | 12/2020 |

OTHER PUBLICATIONS

Yin et al., Reliability of POL-kw Power Modules, Jun. 8, 2017, 2017 International Conference on Electronics Packaging (ICEP), pp. 106-111, Conference Location: Yamagata, Japan.

Ozmat et al., A New Power Module Packaging Technology for Enhanced Thermal Performance, Aug. 6, 2002, ITHERM 2000. The Seventh Intersociety Conference on Thermal and Thermomechanical Phenomena in Electronic Systems (Cat. No.00CH37069), pp. 1089-9870, Conference Location: Las Vegas, NV, USA.

* cited by examiner

LIQUID-COOLED ASSEMBLY AND METHOD

STATEMENT REGARDING FEDERALLY SPONSORED RESEARCH OR DEVELOPMENT

This invention was made with government support under Contract No. W911NF1820101 awarded by the United States Government. The government has certain rights in the invention.

TECHNICAL FIELD

The disclosure generally relates to electrical power module components, and more specifically toward a housing with structures for direct liquid cooling of power module components.

BACKGROUND

Power systems manage the supplying of power from power sources, such as generators, to electrical loads. In one example, gas turbine engines are used for propulsion of aircraft, and typically provide mechanical power which ultimately powers a number of different accessories such as generators, starter/generators, permanent magnet alternators (PMA), fuel pumps, and hydraulic pumps, e.g., equipment for functions needed on an aircraft other than propulsion. For example, contemporary aircraft need electrical power for avionics, motors, and other electric equipment. A generator coupled with a gas turbine engine converts the mechanical power of the engine into electrical energy, which is distributed throughout the aircraft by electrically-coupled nodes of the power distribution system. In addition, the electrical components within such power systems can generate significant amounts of heat during operation, and various mechanisms exist for cooling such systems including heat spreaders, heat exchangers, or the like.

BRIEF DESCRIPTION

Aspects and advantages of the disclosure will be set forth in part in the following description, or may be obvious from the description, or may be learned through practice of the disclosure herein.

In one aspect, the disclosure relates to a liquid-cooled assembly for an electronic component. The assembly includes a housing defining at least one component chamber having an insertion slot provided on an exterior of the housing, a first impingement sprayer located on a first side of the component chamber, a second impingement sprayer located on a second side of the component chamber, an inlet on the housing fluidly coupled to the impingement sprayers, an outlet on the housing fluidly coupled to the component chamber, and a liquid coolant circuit passing through the housing from the inlet, through at least one of the first impingement sprayer or the second impingement sprayer, through the component chamber, and to the outlet.

In another aspect, the disclosure relates to a method of cooling an electronic component having a set of heat-generating components coupled to a substrate. The method includes flowing liquid coolant through a supply line to first and second impingement sprayers located on opposite sides of the electronic component, emitting an impinging spray of the liquid coolant from the first and second impingement sprayers onto at least two opposite surfaces of the electronic component within a component chamber, and directing the sprayed liquid coolant out of the component chamber through a return line fluidly coupled to the component chamber.

These and other features, aspects and advantages of the disclosure will become better understood with reference to the following description and appended claims. The accompanying drawings, which are incorporated in and constitute a part of this specification, illustrate the disclosure and, together with the description, serve to explain the principles of the disclosure herein.

BRIEF DESCRIPTION OF THE DRAWINGS

A full and enabling disclosure, including the best mode thereof, directed to one of ordinary skill in the art, is set forth in the specification, which makes reference to the appended figures in which.

DETAILED DESCRIPTION

Figure 1:
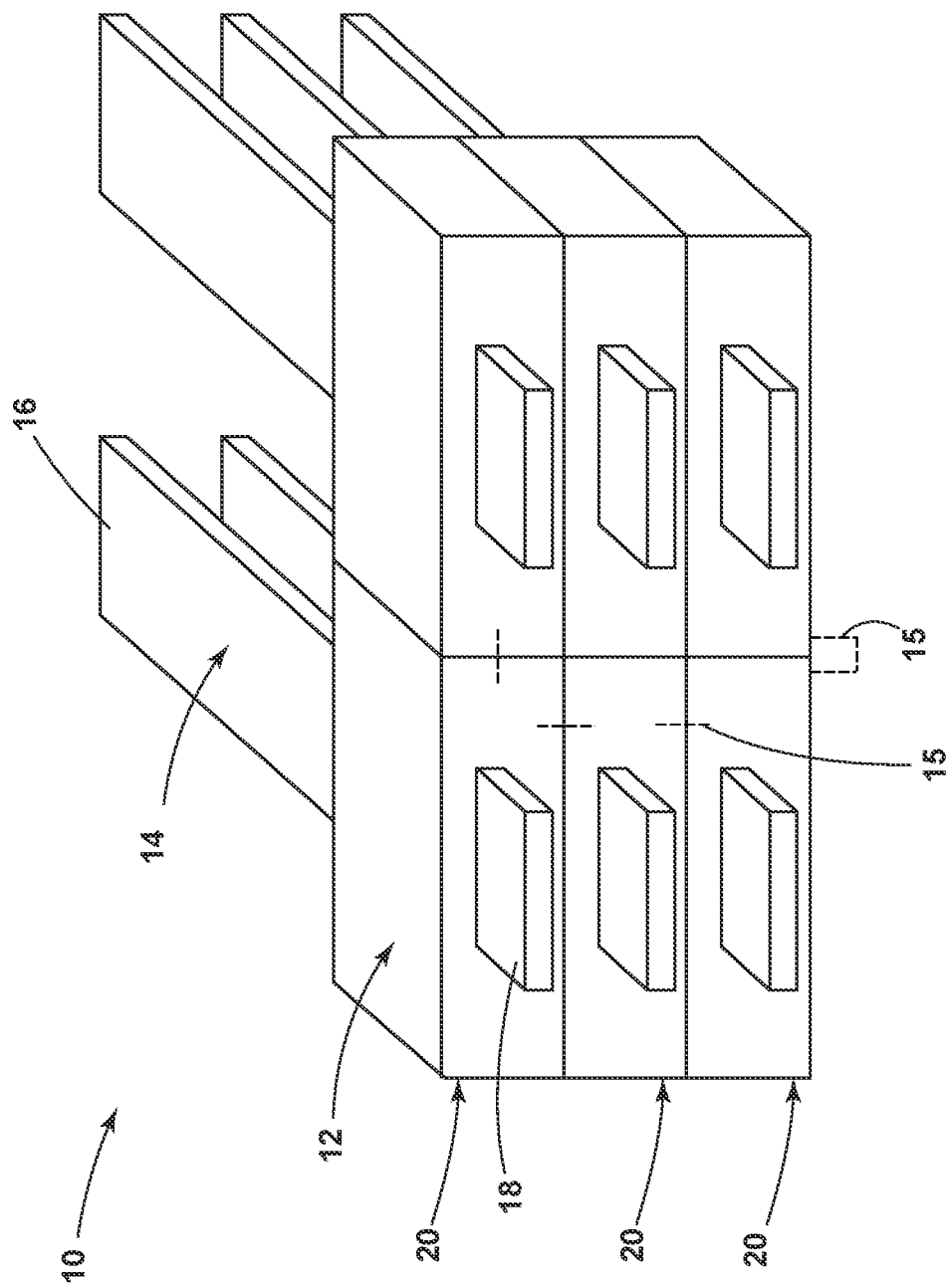
FIG. 1 is a schematic perspective view of a modular liquid-cooled assembly for an electronic component in the form of a power overlay (POL) tile in accordance with various aspects described herein.

Aspects of the present disclosure are directed to an electrical power assembly or an electrical power architecture. For the purposes of illustration, the present disclosure will be described in one exemplary environment of an aircraft power system. It will be understood that aspects of the disclosure can have general applicability to any power system, as well as in non-aircraft applications, such as other mobile applications and non-mobile industrial, commercial, and residential applications.

Typical power electronics device chips are generally interconnected with fragile wire or ribbon bonding that extends above the device surface on one side and restricts the main heat extraction path from the chips to the other side of the device. Conventional wire or ribbon bonded devices do not allow for easy double-sided cooling or stacking of the power modules. This results in two-dimensional or planar "tiled" device configurations that attach to a separate planar cold plate. Such cold plates have additional thermal resistances in the heat transfer path and have lower thermal performance relative to direct contact forced convection on the device itself.

In addition, cooling fluid performance varies for different types of fluids. Electrically insulating cooling fluids (e.g. oil) generally have lower thermal performance for a given pumping power compared to other, less-insulative cooling fluids (e.g. water) for direct contact cooling.

Aspects of the disclosure enable an apparatus and method for power electronic device cooling by direct liquid impingement on multiple sides of the device. In one non-limiting example, electronic components such as power overlay (POL) tiles are fabricated with a wirebondless configuration that results in a compact, planar form factor. Such POL tiles are inserted into a housing that provides direct contact or impingement jets of cooling liquid located directly adjacent portions of the POL tiles requiring cooling, such as silicon carbide (SiC) chips, bus bars, or the like. The housing includes leak-tight feedthroughs into which the POL tiles can be inserted and electrical connections made to other devices. These and other aspects of the disclosure will be described herein in further detail.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements.

While "a set of" various elements will be described, it will be understood that "a set" can include any number of the respective elements, including only one element. Additionally, while terms such as "voltage," "current," and "power" can be used herein, it will be evident to one skilled in the art that these terms can be interchangeable when describing aspects of an electrical circuit or circuit operations.

The disclosure can be implemented in any electrical circuit environment having a switch. One non-limiting example of an electrical circuit environment that can include aspects of the disclosure can include an aircraft power system architecture, which enables production of electrical power from at least one spool of a turbine engine, such as a gas turbine engine, and delivers the electrical power to a set of electrical loads via at least one solid state switch, such as a solid state power controller (SSPC) switching device. One non-limiting example of the SSPC can include metal-oxide-semiconductor field-effect transistor (MOSFET), such as a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein.

The exemplary drawings are for purposes of illustration only and the dimensions, positions, order and relative sizes reflected in the drawings attached hereto can vary.

FIG. 1 is a schematic illustration of one exemplary liquid-cooled assembly 10 (hereafter "assembly 10") for an electronic component in accordance with various aspects described herein. The electronic component will be described in the exemplary form of a power overlay (POL) tile 14. Aspects of the disclosure can be applied to any suitable electronic component, including a printed circuit board (PCB) card or a PCB tile in non-limiting examples.

The assembly 10 includes multiple coupled housings 12 carrying corresponding POL tiles 14. In the example shown, one POL tile 14 is positioned within a corresponding housing 12 though this need not be the case.

Each POL tile 14 extends from a first end 16 to a second end 18. The POL tiles 14 can be supplied with power at the second end 18, for example via a generator, bus, or other power source, and can switchably deliver the supplied power to connected devices via the first end 16. In contrast to conventional devices utilizing multiple wire bonds for device attachment, it is contemplated that the POL tiles 14 can include a wirebondless architecture wherein direct connection is enabled to reduce inductance, improve device switching performance, or decrease device switching times. Particular details of the POL tiles 14 will not be described except where needed to improve clarity or understanding of the present disclosure.

The assembly 10 can be in the form of a modular assembly. In the example shown, one housing 12 and one POL tile 14 collectively define a modular unit 20. Additionally or alternatively, a modular unit 20 can be defined by a single housing 12 receiving multiple POL tiles 14. Each modular unit 20 can be fastened, stacked, or otherwise coupled together to extend in at least two directions, such as horizontally and vertically in a non-limiting example. In this manner, the assembly 10 can have multiple modular units coupled together and arranged along multiple directions to form a multi-dimensional liquid-cooled assembly with increased power density for meeting power demands.

In one non-limiting example, the liquid-cooled assembly 10 can include one or more fluid connections 15 (illustrated schematically in dashed line). Any number of fluid connections 15 can be utilized. Such fluid connections 15 can provide a fluid inlet to a modular unit 20, a fluid outlet to a modular unit 20, or a fluid coupling between two modular units 20, in non-limiting examples.

Figure 2:
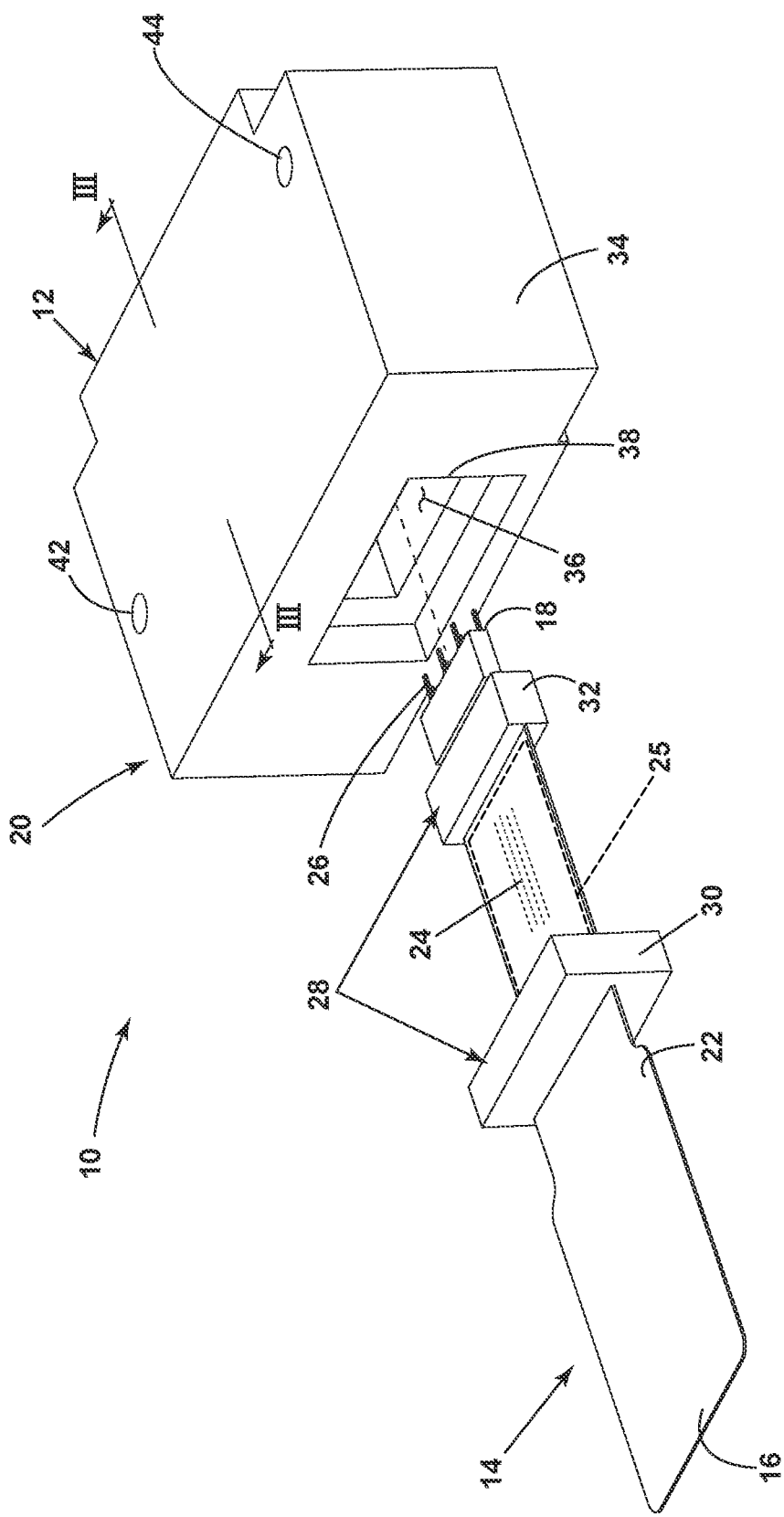
FIG. 2 is a schematic perspective view of one modular unit in the assembly of FIG. 1.

Turning to FIG. 2, one exemplary modular unit 20 with housing 12 and POL tile 14 is illustrated that can be utilized in the assembly 10. The POL tile 14 further includes a substrate 22 carrying a set of electrical devices 24. The set of electrical devices 24 can include solid state switching devices, gate devices configured to operate the gates of the respective solid-state switching devices, rectifying components such as diodes, power storage devices such as batteries, or the like, or any combination thereof. The second end 18 includes a pinout connector 26 for connection to other electrical devices as needed. Optionally, an insulating or dielectric coating 25 can be provided on any portion of the POL tile 14, including over the set of electrical devices 24, or over the entire POL tile 14. Such a coating 25 can include any suitable insulating material, including silicone or parylene in non-limiting examples. In the illustrated example, the coating 25 is illustrated over a portion of the substrate 22 including the set of electrical devices 24 though this need not be the case.

A sealing element 28 can be provided in the assembly 10. In the example shown, the sealing element 28 is coupled to the POL tile 14. Additionally or alternatively, the sealing element 28 can be coupled to either or both of the housing 12 or the POL tile 14. In the example shown, includes a first seal 30 proximate the first end 16 and a second seal 32 proximate the second end 18 as shown. The sealing element 28 can be formed of any suitable material including, but not limited to, rubber, silicone, dielectric materials, polymeric materials, composite materials, or fiberglass materials, or the like, or combinations thereof. In addition, while illustrated as including a pair of seals, the sealing element 28 can include any number of seals, including only one, or three or more. In another non-limiting example, the sealing element 28 can be formed as a unitary body coupled to the POL tile 14 at multiple locations, such as a U-shaped sealing body coupled to the POL tile 14 at distal ends thereof. Still further, while the sealing element 28 is illustrated as a generally rectangular element, this is merely for the purposes of visual clarity and the design, size, or shape of the sealing element 28 is not limited thereto. The sealing element 28 can have any suitable geometric profile, as well as other components including locking mechanisms, fasteners, or the like, as is known in the art.

The housing 12 includes an outer wall 34 bounding an interior 36. An aperture in the form of a first insertion slot 38 extends through the outer wall 34 to the interior 36. The POL tile can be inserted into the housing 12 through the first insertion slot 38 as shown.

Any suitable manufacturing method or process can be utilized in forming the assembly 10, including casting, machining, or additive manufacturing. As used herein, "additive manufacturing" (AM) will refer to a process wherein the component is built layer-by-layer by successive deposition of material. AM is an appropriate name to describe the technologies that build 3D objects by adding layer-upon-layer of material, whether the material is plastic or metal. AM technologies can utilize a computer, 3D modeling software (Computer Aided Design or CAD), machine equipment, and layering material. Once a CAD sketch is produced, the AM equipment can read in data from the CAD file and lay down or add successive layers of liquid, powder, sheet material or other material, in a layer-upon-layer fashion to fabricate a 3D object. It should be understood that the term "additive manufacturing" encompasses many technologies including subsets like 3D Printing, Rapid Prototyping (RP), Direct Digital Manufacturing (DDM), layered manufacturing, and additive fabrication. Non-limiting examples of additive manufacturing that can be utilized to form an additively-manufactured component include powder bed fusion, vat photopolymerization, binder jetting, material extrusion, directed energy deposition, material jetting, or sheet lamination.

Figure 3:
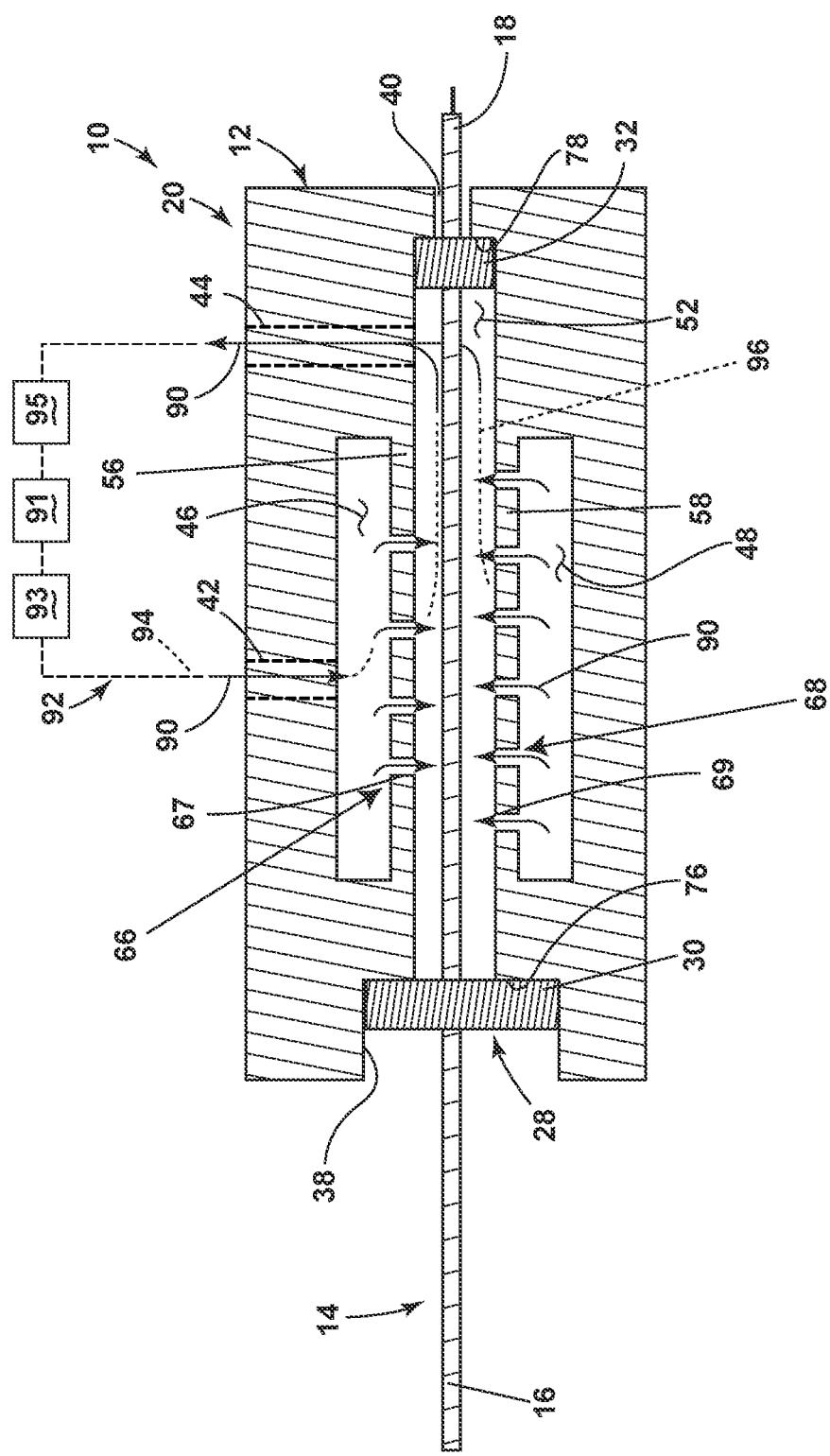
FIG. 3 is a schematic cross-sectional view of the modular unit of FIG. 2 along the line III-III.

FIG. 3 illustrates a schematic sectional view of the housing 12 and POL tile 14 after insertion. For visual clarity, the coating 25 is not illustrated in FIG. 3. It will be understood that any portion of the POL tile 14 can include the dielectric coating 25.

The housing 12 further includes a second slot 40 through the outer wall 34 extending to the interior 36. In the illustrated example, the second slot 40 is in registry with the first insertion slot 38 though this need not be the case. The first end 16 of the POL tile 14 is positioned adjacent the first insertion slot 38. The second end 18 of the POL tile 14 is positioned adjacent the second slot 40. In this manner, the second end 18 can be received by or extend through the second slot 40, for example to provide for external access to the pinout connector 26 (FIG. 1). In another example, the second end 18 can remain within the housing 12 when the POL tile is inserted through the first insertion slot 38, with no additional slot required.

It is further contemplated that the housing 12 can provide for liquid impingement cooling of the POL tile 14. More specifically, the outer wall 34 of the housing 12 can define at least one fluid inlet 42 and a fluid outlet 44. Multiple fluid inlets 42 and multiple fluid outlets 44 can be provided, though this need not be the case. A first fluid channel 46 and a second fluid channel 48 can be located within the housing 12 and fluidly coupled to the fluid inlet 42. A central component chamber 52 in the form of an impingement chamber can be positioned between the first fluid channel 46 and second fluid channel 48 and be fluidly coupled to the fluid outlet 44. A first interior wall 56 divides the first fluid channel 46 from the component chamber 52. A second interior wall 58 divides the second fluid channel 48 from the component chamber 52. In this manner, the first interior wall 56 can form a first side of the component chamber 52, and the second interior wall 58 can form a second side of the component chamber 52.

A first impingement sprayer 66 and a second impingement sprayer 68 direct an impingement flow onto the POL tile 14. The impingement sprayers can be located on opposite sides of the POL tile 14 or on opposite sides of the component chamber 52. As illustrated, one possible implementation is to incorporate the impingement sprayers 66, 68 into the respective first interior wall 56 and second interior wall 58. In the example shown, the first impingement sprayer 66 is in the form of a first set of impingement holes 67 extending through the first interior wall 56, and the second impingement sprayer 68 is in the form of a second set of impingement holes 69 extending through the second interior wall 58. The impingement sprayers 66, 68 can have any suitable form, including circular holes, rectangular slots, jet nozzles, showerhead nozzles, or the like, in non-limiting examples. In another non-limiting example, either or both of the impingement sprayers 66, 68 can include a sprayer body or nozzle coupled to a liquid supply line. Either or both of the first impingement sprayer 66 or the second impingement sprayer 68 can also fluidly couple the respective first fluid channel 46 and second fluid channel 48 to the component chamber 52 as shown. In this manner, the first interior wall 56 and the second interior wall 58 can at least partially define the component chamber 52.

Any number of impingement sprayers can be provided. In addition, any number of impingement holes can be provided in the first set of impingement holes 67 and the second set of impingement holes 69. In the example shown, the first set of impingement holes 67 contains fewer impingement holes than the second set of impingement holes 69 though this need not be the case. For example, the POL tile 14 can have discrete or localized heated regions or "hot spots" during operation. In such a case, a cluster of impingement sprayers or holes can be positioned adjacent to or confronting such regions to provide for localized impingement cooling. The number and positioning of impingement sprayers can be tailored to the power overlay tile for improved cooling and efficiency. Furthermore, the relative size, positioning, and arrangement of impingement sprayers can be adjusted or tailored based on a rate of fluid flow through the liquid supply line. In one non-limiting example, the supply line and impingement sprayers can be configured to provide a fluid velocity or jet velocity through the impingement sprayers of between 0.1 m/s and 1 m/s, or between 1 m/s and 3 m/s, or greater than 3 m/s.

When the POL tile 14 is inserted into the POL chamber 52, the sealing element 28 can abut or contact a corresponding inner surface or interior surface of the housing 12. In the illustrated example, the first seal 30 abuts a first surface 76 adjacent the first insertion slot 38, and the second seal 32 abuts a second surface 78 adjacent the second slot 40 though this need not be the case. The sealing element 28 can provide for fluid sealing of the impingement chamber 52 and prevent leakage through the first insertion slot 38 or second slot 40. In this manner, the first interior wall 56, the second interior wall, or the sealing element 28 can at least partially define the component chamber 52.

With general reference to FIGS. 1-3, during operation, heat can be generated by the set of electrical devices 24 on the POL tile 14. Liquid coolant 90 such as water, water-ethylene glycol, oil, or dielectric fluid can flow into the housing 12 by the fluid inlet 42. In a non-limiting example where the POL tile 14 includes the dielectric coating 25, water can be used for the liquid coolant 90 while maintaining electrical insulation of components in the POL tile 14.

More specifically, the liquid coolant 90 can enter the first fluid channel 46 and second fluid channel 48, flow through the first and second impingement sprayers 66, 68, and impinge upon opposing sides of the POL tile within the chamber 52 before exiting the housing 12 through the fluid outlet 44. In this manner, a liquid coolant circuit 92 can pass through the housing 12 from the fluid inlet 42, to at least one of the first fluid channel 46 or the second fluid channel 48, to at least one of the first impingement sprayer 66 or the second impingement sprayer 68, to the component chamber 52, and to the fluid outlet 44. A supply line 94 can be at least partially defined by the fluid inlet 42 and one or both impingement sprayers 66, 68. A return line 96 can be at least partially defined by the component chamber 52 and fluid outlet 44. The supply line 94 and return line 96 can at least partially form the liquid coolant circuit 92. In this manner, the housing 12 can provide for at least double-sided liquid impingement cooling of the POL tile 14 inserted therein.

It is also contemplated that, in one possible implementation, the liquid coolant 90 can be recirculated between the return line 96 and supply line 94. In the illustrated example, the liquid coolant 90 can be drawn from a reservoir 91 by a pump 93. The pump 93 can direct the liquid coolant 90 to the supply line 94 for impingement cooling of the POL tile 14. The return line 96 can direct the liquid coolant 90 out of the housing 12 to a heat exchanger 95 or other cooling mechanism for removing excess heat contained in the coolant from the POL tile 14. The reduced-temperature liquid coolant 90 can then be directed back to the supply line 94 for further or continued impingement cooling of the POL tile 14 within the housing 12. The reservoir 91, pump 93, and heat exchanger 95 are illustrated along a common portion of the liquid coolant circuit 92 for visual clarity. It will be understood that the liquid coolant circuit 92 can include other portions, branches, or the like, as well as other components such as valves, switches, or the like, as is known in the art.

Some additional non-limiting examples or implementations of the assembly 10 and modular units 20 will be described below. It will be understood that such examples are given for illustrative purposes.

In one exemplary implementation, multiple modular units 20 can be fluidly coupled together between corresponding fluid inlets 42 and fluid outlets 44. In one example, the fluid outlet of a first modular unit can be coupled to a fluid inlet of a second modular unit, such that multiple modular units are fluidly coupled in series and share a common liquid coolant circuit.

In another exemplary implementation, two modular units can be provided with fluidly separated liquid coolant circuits. For example, a first modular unit can be provided with a first coolant, and a second modular unit can be provided with a second coolant. Such an arrangement could be utilized for cooling two distinct types of electronic components, such as a POL tile and a POL card in one non-limiting example.

In another exemplary implementation, a first group of modular units can share a first liquid coolant circuit, e.g. with fluid inlets coupled to fluid outlets in series, while a second group of modular units share a second liquid coolant circuit.

In another exemplary implementation, a single modular unit 20 can be provided with multiple liquid coolant circuits. For example, the housing can include a first fluid inlet and a first fluid outlet, with a first liquid coolant circuit extending through the housing therebetween. The housing can also include a second fluid inlet and a second fluid outlet, with a second liquid coolant circuit extending through the housing therebetween. The first and second liquid coolant circuits can carry the same or different liquid coolants. In one example, the first liquid coolant circuit is fluidly coupled to one side of the electronic component, and the second liquid coolant circuit is fluidly coupled to another side of the electronic component. In one example, the first liquid coolant circuit impinges coolant at a first velocity onto the one side of the electronic component, and the second liquid coolant circuit impinges coolant at a second velocity onto the second side of the electronic component. In one example, the first liquid coolant circuit provides a first coolant, e.g. oil, to the one side of the electronic component, and the second liquid coolant circuit provides a second coolant, e.g. water, to the other side of the electronic component.

It is contemplated that the modular liquid-cooled assembly 10 can have one or multiple types of coolant supplied to each modular unit. It is also contemplated that the modular liquid-cooled assembly 10 can have one or multiple types of coolant supplied to each electronic component, such as a POL tile, contained therein. The one or multiple types of coolant can be tailored to each modular unit, or to each component chamber, based on cooling needs, performance, or other considerations.

Figure 4:
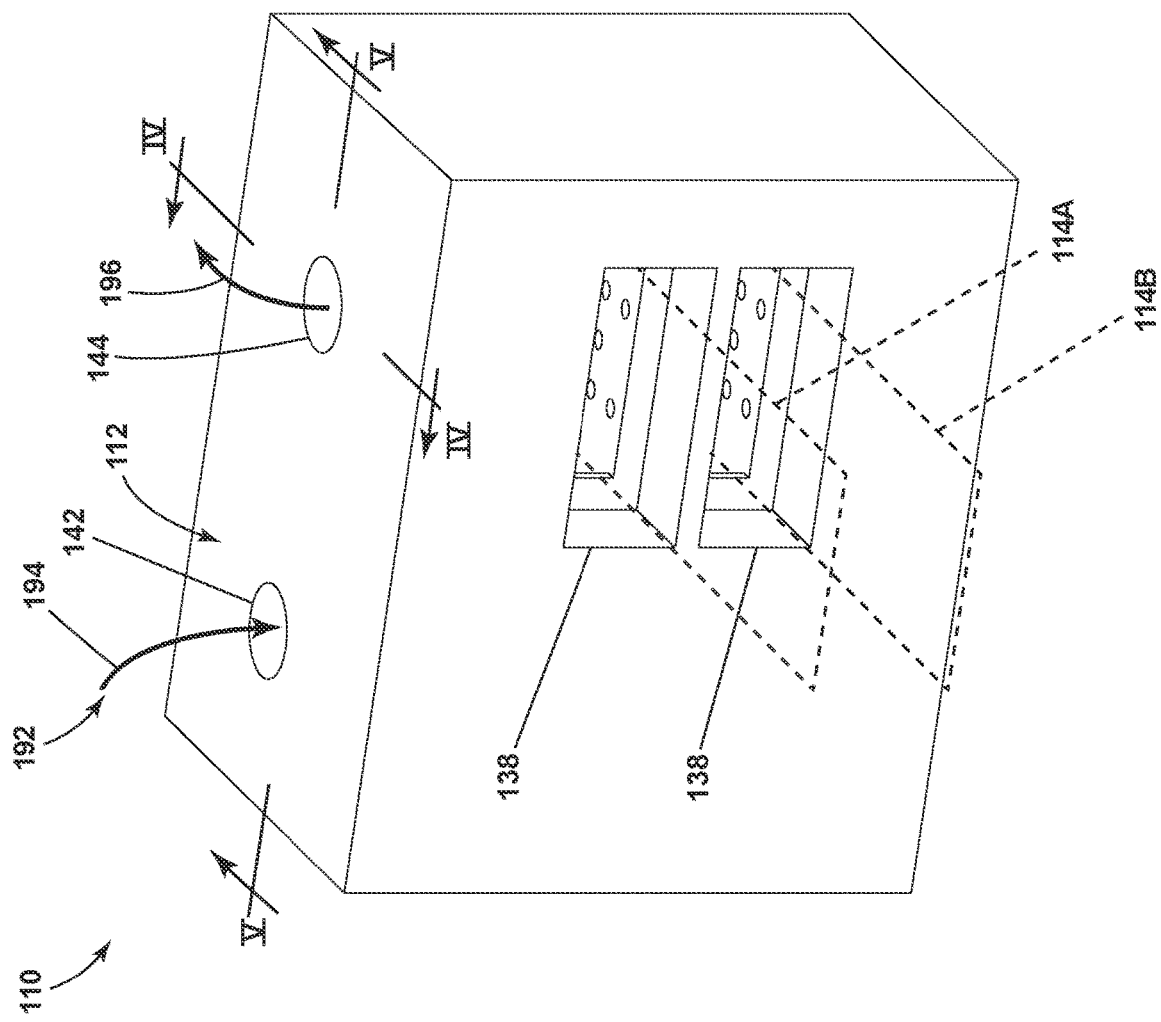
FIG. 4 is a perspective view of another modular liquid-cooled assembly for an electronic component in accordance with various aspects described herein.

Referring now to FIG. 4, another liquid-cooled assembly 110 is illustrated. The assembly 110 is similar to the assembly 10; therefore, like parts will be described with like numerals increased by 100, with it being understood that the description of the like parts of the assembly 10 applies to the assembly 110, except where noted.

The assembly 110 including a housing 112 with a fluid inlet 142 and a fluid outlet 144. One difference compared to the assembly 10 is that the housing 112 includes multiple insertion slots 138 configured to receive multiple electronic components, for example multiple POL tiles. In the example shown, the housing 112 is configured to receive a first POL tile 114A and a second POL tile 114B (illustrated in dashed outline). The first POL tile 114A and second POL tile 114B can be received within the housing 112 in a stacked configuration. It will be understood that the housing 112 can accommodate any number of POL tiles, including a single POL tile, or three or more POL tiles. In addition, the POL tiles can be arranged in any suitable manner within the housing 112, including in a stacked configuration, a planar configuration, an annular configuration, or the like, or combinations thereof. Furthermore, multiple housings 112 can be provided and coupled together to form a modular power overlay assembly or arrangement. Such a modular power overlay assembly can also be formed extending in multiple directions.

A liquid supply line 194 is illustrated entering the fluid inlet 142, and a liquid return line 196 is illustrated exiting the fluid outlet 144. It is also contemplated that coolant can be recirculated from the return line 196 to the supply line 194 as described above. Additionally or alternatively, a dielectric coating similar to the dielectric coating 25 can be provided on either or both of the first POL tile 114A and the second POL tile 114B, including on any portion thereof.

Figure 5:
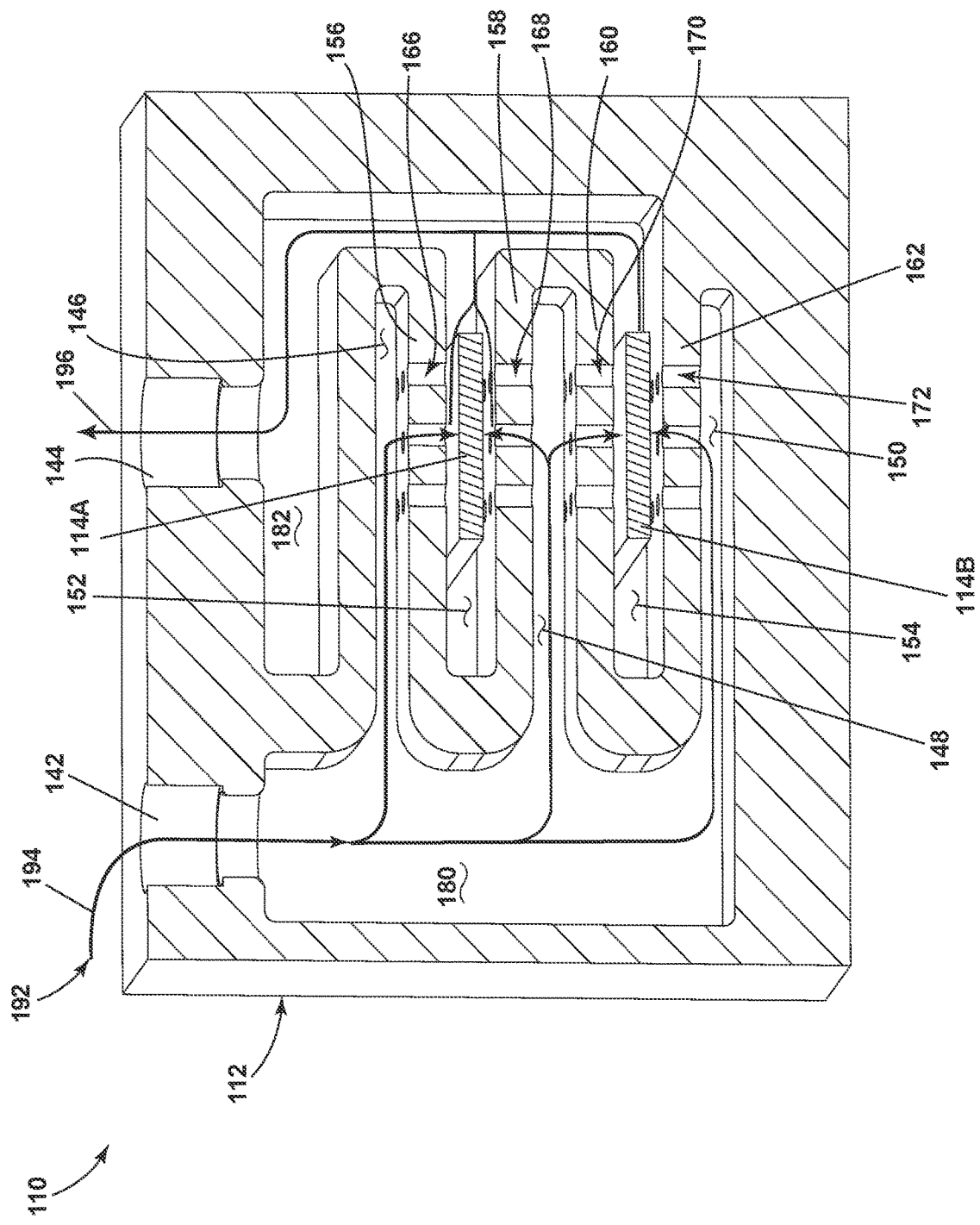
FIG. 5 is a cross-sectional view of the assembly of FIG. 4 along line V-V.

Turning to FIG. 5, a cross-sectional view of the housing 112 along line V-V is illustrated with the first and second POL tiles 114A, 114B in position. The fluid inlet 142 is coupled to an interior inlet chamber 180 that can feed one or more fluid channels, illustrated as a first fluid channel 146, a second fluid channel 148, and a third fluid channel 150. A first POL tile 14A is inserted into a first component chamber 152, and a second POL tile 14B is inserted into a second component chamber 154. The first and second component chambers 152, 154 can fluidly couple to an interior outlet chamber 182. The interior outlet chamber 182 can fluidly couple to the fluid outlet 144.

The housing 112 can include multiple interior walls dividing and forming the corresponding fluid channels and component chambers. In the example shown, a first interior wall 156 separates and at least partially defines the first fluid channel 146 and first component chamber 152. A second interior wall 158 separates and at least partially defines the second fluid channel 148 and the first component chamber 152. A third interior wall 160 separates and at least partially defines the second fluid channel 148 and the second component chamber 154. A fourth interior wall 162 separates and at least partially defines the third fluid channel 150 and the second component chamber 154. In this manner, the first and second interior walls 156, 158 form opposing sides of the first component chamber 152, and the third and fourth interior walls 160, 162 form opposing sides of the second component chamber 154.

While the fluid channels 146, 148, 150 and POL chambers 152, 154 are illustrated in a stacked configuration, any arrangement or positioning of interior walls, fluid channels, and component chambers can be utilized. In one example, the POL tiles can be received vertically within the housing such that cooling liquid impinges an upper portion of the POL tile and flows downward along the surface of the POL tile by gravity. In another example, the POL tiles can be positioned in multiple orientations within a common housing, including horizontally, vertically, diagonally, or the like, or combinations thereof.

Furthermore, a first impingement sprayer 166, second impingement sprayer 168, third impingement sprayer 170, and fourth impingement sprayer 172 can be provided for directing impingement flows onto either or both of the POL tiles 114A, 114B. As illustrated, one possible implementation is to incorporate the impingement sprayers 166, 168, 170, 172 in the respective first interior wall 156, second interior wall 158, third interior wall 160, and fourth interior wall 162. The impingement sprayers 166, 168, 170, 172 are each illustrated as including sets of impingement holes that can fluidly couple the corresponding fluid channel and POL chamber separated by each interior wall 156, 158, 160, 162.

A liquid coolant circuit 192 passes through the housing 112 and includes a supply line 194 and return line 196. For visual clarity, coolant is not illustrated within the housing 112. It will be understood that liquid coolant can flow through the liquid coolant circuit 192 including the supply line 194 and return line 196.

In the illustrated example showing one possible implementation of the liquid coolant circuit 192, the supply line 194 of the illustrated example passes through the fluid inlet 142 to the inlet chamber 180, continues to the first fluid channel 146, second fluid channel 148, and third fluid channel 150, and enters the first impingement sprayer 166, second impingement sprayer 168, and third impingement sprayer 170. The return line 196 passes from the first component chamber 152 and second component chamber 154 to the outlet chamber 182 and to the fluid outlet 144.

Figure 6:
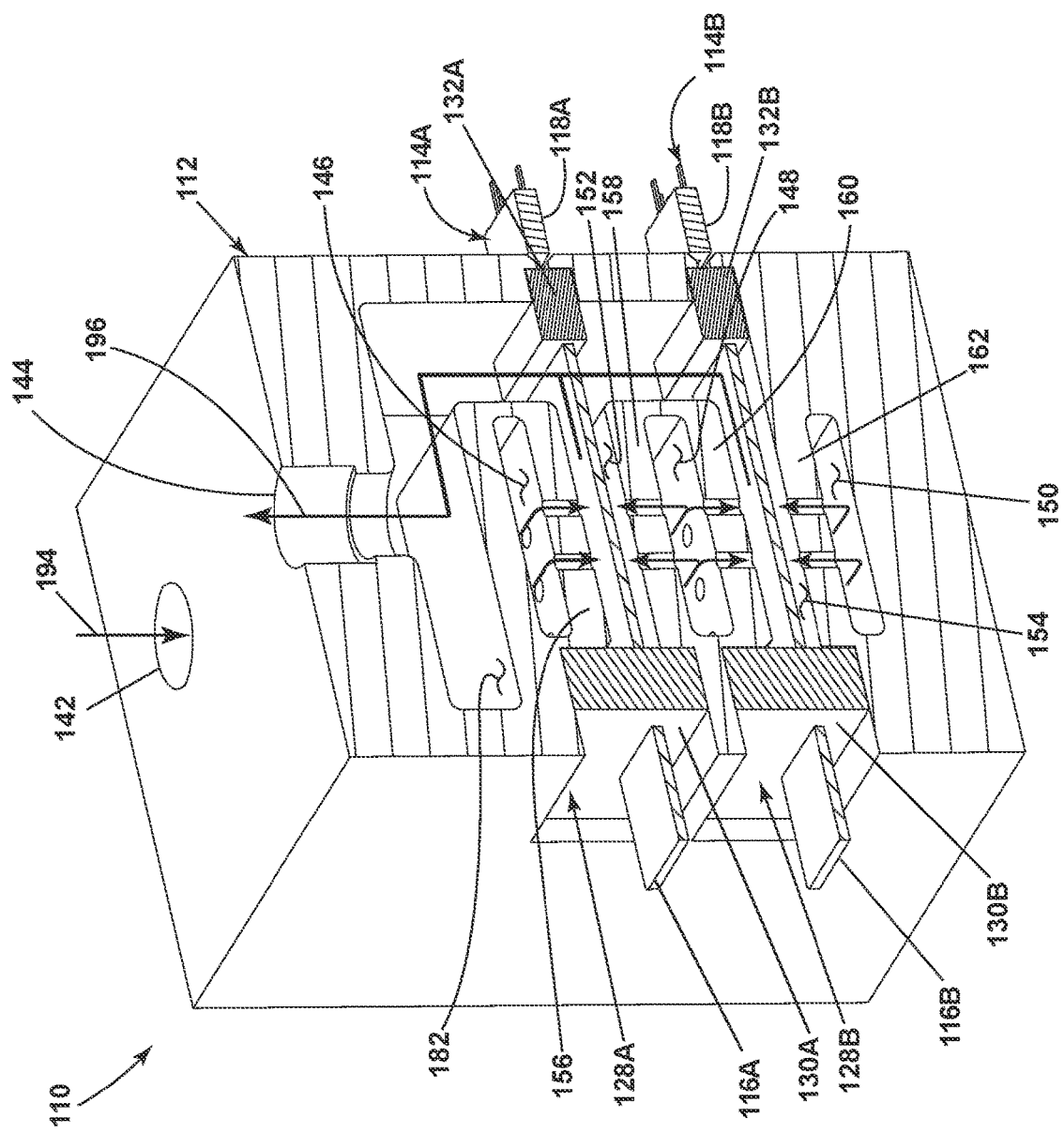
FIG. 6 is a cross-sectional view of the assembly of FIG. 4 along line VI-VI.

FIG. 6 illustrates another cross-sectional view of the housing 112 along the line VI-VI (FIG. 4) and illustrates the liquid coolant circuit 192 in an alternate perspective. A first sealing element 128A and a second sealing element 128B can be provided in the assembly 110. In the example shown, the first sealing element 128A is coupled to the first POL tile 114A, and a second sealing element 128B is coupled to the second POL tile 114B, though this need not be the case. In another non-limiting example, either or both of the sealing elements 128A, 128B can be coupled directly to the housing 112.

The first sealing element 128A of the illustrated example includes first seal 130A and second seal 132B, and the second sealing element 128B includes first seal 130B and second seal 132B as shown. More specifically, the first seals 130A, 130B are located proximate the respective first ends 116A, 116B, and the second seals 132A, 132B are located proximate the respective second ends 118A, 118B of the respective first and second POL tiles 114A, 114B. In this manner, the first and second sealing elements 128A, 128B can provide for fluid sealing of the corresponding first and second component chambers 152, 154.

Figure 7:
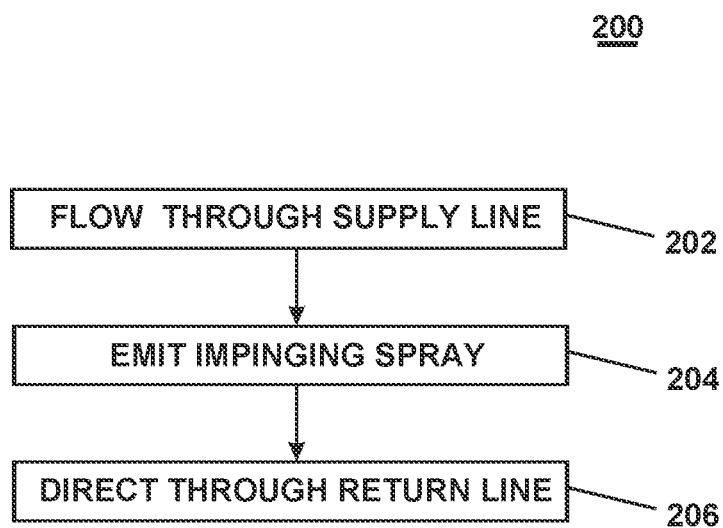
FIG. 7 is a flowchart illustrating a method of cooling an electronic component in accordance with various aspects described herein.

With general reference to FIGS. 5-7, liquid coolant can flow through the liquid coolant circuit 192 through the supply line 194, entering the fluid inlet 142 and inlet chamber 180. The liquid coolant can then be directed into the first fluid channel 146, second fluid channel 148, and third fluid channel 150. The first and second sprayers 166, 168 can emit an impinging spray of liquid coolant onto opposing sides of the first POL tile 114A within the component chamber 152. The third and fourth impingement sprayers 170, 172 can emit an impinging spray of liquid coolant onto opposing sides of the POL tile 114B within the second component chamber 154, thereby removing heat from the POL tiles 114A, 114B during operation. The warmed coolant can be directed through the return line 196 to the outlet chamber 182 and exit the housing 112 via fluid outlet 144.

FIG. 7 illustrates a method 200 of cooling an electronic component having a set of heat-generating components coupled to a substrate, such as the POL tiles 14, 114A, 114B. The method 200 begins at 202 by flowing liquid coolant 90 through a supply line 94, 194 to first and second impingement sprayers 66, 68, 166, 168, 170, 172 located on opposite sides of the electronic component, such as the POL tile 14, 114A, 114B. At 204, the method 200 includes emitting an impinging spray of the liquid coolant 90 from the first and second impingement sprayers 66, 68, 166, 168, 170, 172 onto at least two opposite surfaces of the electronic component, such as the POL tile 14, 114A, 114B, within the component chamber 52, 152, 154. At 206, the method includes directing the sprayed liquid coolant 90 out of the component chamber 52, 152, 154 through return line 96, 196 fluidly coupled to the component chamber 52, 152, 154.

Optionally, the method 200 includes directing the liquid coolant 90 into at least two fluid channels 46, 48, 146, 148, 150 within a housing 12, 112. The at least two fluid channels 46, 48, 146, 148, 150 can be positioned upstream of the impingement sprayers 66, 68, 166, 168, 170, 172. Optionally, the method 200 includes flowing the liquid coolant 90 through a set of impingement holes 67, 69 in an interior wall 56, 58, 156, 158, 160, 162 of the housing 12, 112 into the component chamber 52, 152, 154, with the set of impingement holes 67, 69 at least partially defining the first and second impingement sprayers 66, 68, 166, 168, 170, 172. Optionally, the method 200 includes flowing the liquid coolant 90 into an inlet chamber 180 upstream of the at least two fluid channels 46, 48, 146, 148, 150 and at least partially defining the supply line 94, 194. Optionally, the method 200 includes directing the liquid coolant 90 from the component chamber 52, 152, 154 into a downstream outlet chamber 182 at least partially defining the return line 96, 196. Optionally, the method 200 includes drawing the liquid coolant 90 into the housing 12, 112 carrying the electronic component, such as the POL tile 14, 114A, 114B by way of the fluid inlet 42, 142 at least partially forming the supply line 94, 194, and removing the liquid coolant 90 from the housing 12, 112, by way of the fluid outlet 44, 144 at least partially forming the return line 96, 196. The liquid coolant 90 can be drawn from an external reservoir in one non-limiting example. Optionally, the method 200 includes recirculating the liquid coolant 90 from the return line 96, 196 back to the supply line 94, 194.

Aspects of the disclosure provide for a variety of benefits. The liquid-cooled assemblies described herein can include replaceable building blocks or tiles having a substantially similar underlying form factor (e.g. footprint, or common connections), that can provide low-cost manufacturability and interactive placement for a POL module assembly or other power module assembly. Common or reusable form factors can further result in higher process or manufacturing yields, and different module configuration without significant design changes. In addition, the assembly described provides for improved repairability, as a given power overlay tile can be easily removed, replaced, or serviced as needed. The sealed, modular housing provides for a compact, ultra-high-power density assembly of multiple devices into a power electronics system. The housing design described herein allows for replaceable or permanently installed and sealed power electronics devices.

The use of direct liquid impingement or spray provides for improved cooling of the power overlay tiles compared to traditional designs utilizing heat spreaders, conductive plates, or the like. Multiple sides of the power overlay tiles can be simultaneously cooled by direct liquid contact, including on opposing sides of the tiles, thereby reducing cooling time and improving performance of the power overlay assembly. In examples where a dielectric coating is utilized with the tile surface, the power overlay tile design further allows for the use of non-insulating cooling fluids (e.g. water) having better cooling performance compared to insulating fluids (e.g. oil), including in examples where an insulating coating is provided over the POL tiles.

More compact and efficient cooling approaches are needed for future designs of power electronics systems with higher power densities. Direct contact, forced convection cooling on dual sides of a power electronics device provides for more efficient heat extraction on shorter timescales compared to traditional methods. Forced convection by way of jet impingement or spray further enhances this heat extraction with locally-higher heat transfer coefficients that may be targeted directly opposite each of the internal heat generating components. The sealed and modular housing as described herein allows for higher power density, three-dimensional configurations that are better suited to meet high power demands.

Many other possible aspects and configurations in addition to that shown in the above figures are contemplated by the present disclosure.

To the extent not already described, the different features and structures of the various aspects can be used in combination with each other as desired. That one feature is not illustrated in all of the aspects is not meant to be construed that it is not included, but is done for brevity of description. Thus, the various features of the different aspects can be mixed and matched as desired to form new aspects of the disclosure, whether or not the new aspects are expressly described. All combinations or permutations of features described herein are covered by this disclosure.

This written description uses examples to disclose aspects of the disclosure, including the best mode, and also to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure may also be embodied in any permutation of aspects of the disclosure, including but not limited to the following technical solutions as defined in the enumerated aspects:

1. A liquid-cooled assembly for an electronic component, the assembly comprising a housing defining at least one component chamber having an insertion slot provided on an exterior of the housing, a first impingement sprayer located on a first side of the component chamber, a second impingement sprayer located on a second side of the component chamber, an inlet on the housing fluidly coupled to the impingement sprayers, an outlet on the housing fluidly coupled to the component chamber, and a liquid coolant circuit passing through the housing from the inlet, through at least one of the first impingement sprayer or the second impingement sprayer, through the component chamber, and to the outlet.

2. The liquid-cooled assembly of claim 1, wherein the first impingement sprayer comprises a first set of impingement holes extending through a first interior wall of the housing.

3. The liquid-cooled assembly of any preceding clause, wherein the second impingement sprayer comprises a second set of impingement holes extending through a second interior wall of the housing.

4. The liquid-cooled assembly of any preceding clause, wherein the first set of impingement holes confronts the second set of impingement holes.

5. The liquid-cooled assembly of any preceding clause, wherein the first side of the component chamber is located opposite the second side of the component chamber.

6. The liquid-cooled assembly of any preceding clause, further comprising a sealing element located within the component chamber and abutting an inner surface of the housing to fluidly seal the component chamber.

7. The liquid-cooled assembly of any preceding clause, wherein the electronic component comprises a power overlay (POL) tile, and further comprising multiple component chambers in a stacked configuration within the housing and having multiple corresponding insertion slots configured to receive multiple corresponding POL tiles.

8. The liquid-cooled assembly of any preceding clause, wherein the housing, component chamber, first impingement sprayer, and second impingement sprayer at least partially define a modular unit.

9. The liquid-cooled assembly of any preceding clause, further comprising multiple modular units coupled together and arranged along at least two directions to form a multi-dimensional liquid-cooled assembly.

10. The liquid-cooled assembly of any preceding clause, further comprising a coolant within the liquid coolant circuit and comprising one of water, water-ethylene glycol, oil, or dielectric liquid.

11. The liquid-cooled assembly of any preceding clause, further comprising a second slot provided on the exterior of the housing and in registry with the insertion slot.

12. The liquid-cooled assembly of any preceding clause, wherein each of the insertion slot and the second slot are fluidly coupled to the component chamber.

13. The liquid-cooled assembly of any preceding clause, further comprising an insulating coating on at least a portion of the electronic component.

14. The liquid-cooled assembly of any preceding clause, wherein the insulating coating comprises a dielectric coating.

15. A method of cooling an electronic component having a set of heat-generating components coupled to a substrate, the method comprising flowing liquid coolant through a supply line to first and second impingement sprayers located on opposite sides of the electronic component, emitting an impinging spray of the liquid coolant from the sprayers onto at least two opposite surfaces of the electronic component within a component chamber, and directing the sprayed liquid coolant out of the component chamber through a return line fluidly coupled to the component chamber.

16. The method of any preceding clause, further comprising directing the liquid coolant into at least two fluid channels within a housing, with the at least two fluid channels positioned upstream of the set of impingement sprayers.

17. The method of any preceding clause, further comprising flowing the liquid coolant through a set of impingement holes in an interior wall of the housing into the component chamber, with the set of impingement holes at least partially defining the set of impingement sprayers.

18. The method of any preceding clause, further comprising flowing the liquid coolant into an inlet chamber upstream of the at least two fluid channels and at least partially defining the supply line.

19. The method of any preceding clause, further comprising directing the liquid coolant from the component chamber into a downstream outlet chamber at least partially defining the return line.

20. The method of any preceding clause, further comprising drawing the liquid coolant into a housing carrying the electronic component by way of a housing inlet at least partially forming the supply line.

21. The method of any preceding clause, further comprising removing the liquid coolant from the housing by way of a housing outlet at least partially forming the return line.

22. The method of any preceding clause, further comprising recirculating the liquid coolant from the return line back to the supply line.

What is claimed is:

1. A liquid-cooled assembly for an electronic component, the assembly comprising:
   a housing defining at least one component chamber having a first fixed opening defining an insertion slot provided on an exterior of the housing and a second fixed opening provided on the exterior of the housing;
   a first impingement sprayer located on a first side of the component chamber;
   a second impingement sprayer located on a second side of the component chamber;
   an inlet on the housing fluidly coupled to the first impingement sprayer and the second impingement sprayer;
   an outlet on the housing fluidly coupled to the component chamber;
   the electronic component having a first end and a second end defining an axis between the first end and the second end, the second end being distal from the first end, a first sealing element disposed between the first end and the second end, a second sealing element disposed proximate to the distal second end of the electronic component wherein the first sealing element entirely overlies an axial portion of the electronic component, wherein the electronic component is removably receivable within the insertion slot, and wherein the first sealing element fluidly seals the fixed opening; and
   a liquid coolant circuit passing through the housing from the inlet, through at least one of the first impingement sprayer or the second impingement sprayer, through the component chamber, and to the outlet;
   wherein the second fixed opening is opposite the fixed opening on the housing, in a direction of the receiving of the electronic component.

2. The liquid-cooled assembly of claim 1, wherein the first impingement sprayer comprises a first set of impingement holes extending through a first interior wall of the housing.

3. The liquid-cooled assembly of claim 2, wherein the second impingement sprayer comprises a second set of impingement holes extending through a second interior wall of the housing.

4. The liquid-cooled assembly of claim 3, wherein the first set of impingement holes confronts the second set of impingement holes.

5. The liquid-cooled assembly of claim 1, wherein the first side of the component chamber is located opposite the second side of the component chamber.

6. The liquid-cooled assembly of claim 1, wherein the electronic component comprises a power overlay (POL) tile, and further comprising multiple component chambers in a stacked configuration within the housing and having multiple corresponding insertion slots configured to receive multiple corresponding POL tiles.

7. The liquid-cooled assembly of claim 1, wherein the housing, component chamber, first impingement sprayer, and second impingement sprayer at least partially define a modular unit.

8. The liquid-cooled assembly of claim 7, further comprising multiple modular units coupled together and arranged along at least two directions to form a multi-dimensional liquid-cooled assembly.

9. The liquid-cooled assembly of claim 1, further comprising a coolant within the liquid coolant circuit and comprising one of water, water-ethylene glycol, oil, or dielectric liquid.

10. The liquid-cooled assembly of claim 1, wherein the second fixed opening comprising a second slot provided on the exterior of the housing and in registry with the insertion slot, with the second slot configured to receive a second end of the electronic component.

11. The liquid-cooled assembly of claim 10, wherein each of the insertion slot and the second slot are fluidly coupled to the component chamber.

12. The liquid cooled assembly of claim 1, wherein the second sealing element entirely overlies an axial portion of the electronic component.

13. The liquid cooled assembly of claim 1, wherein the second sealing element is smaller than the first sealing element.

14. The liquid cooled assembly of claim 1, wherein the second sealing element fluidly seals the second fixed opening when the electronic component is removably receivable within the insertion slot.

15. The liquid cooled assembly of claim 1, wherein the second fixed opening is smaller than the fixed opening.

16. The liquid cooled assembly of claim 1, wherein the liquid coolant circuit is at least partially bound by the first sealing element and the second sealing element.

\* \* \* \* \*